(12) United States Patent
Wang et al.

(10) Patent No.: US 7,473,655 B2
(45) Date of Patent: Jan. 6, 2009

(54) METHOD FOR SILICON BASED DIELECTRIC CHEMICAL VAPOR DEPOSITION

(75) Inventors: Yaxin Wang, Fremont, CA (US); Yuji Maeda, Sakae-machi (JP); Thomas C. Mele, Livermore, CA (US); Sean M. Seutter, San Jose, CA (US); Sanjeev Tandon, Sunnyvale, CA (US); R. Suryanarayanan Iyer, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 245 days.

(21) Appl. No.: 11/155,646

(22) Filed: Jun. 17, 2005

(65) Prior Publication Data

US 2006/0286818 A1 Dec. 21, 2006

(51) Int. Cl.
*H01L 21/31* (2006.01)
(52) U.S. Cl. .................. 438/791; 438/793; 438/794
(58) Field of Classification Search .......... 438/791–794
See application file for complete search history.

(56) References Cited

U.S. PATENT DOCUMENTS 4,801,468 A * 1/1989 Ishihara et al. .............. 427/563
6,630,413 B2 * 10/2003 Todd ........................... 438/795
6,962,859 B2 * 11/2005 Todd et al. ................... 438/791
2005/0048204 A1 * 3/2005 Dussarrat et al. .......... 427/248.1
2005/0109276 A1    5/2005 Iyer et al.
2006/0084283 A1 * 4/2006 Paranjpe et al. .............. 438/791

FOREIGN PATENT DOCUMENTS

DE              004214944 A1 * 11/1993

OTHER PUBLICATIONS

Tamaoke, et al., "Low Temperature Solution for Silicon Nitride LPCVD Using Cl-Free Inorganic Trisilylamine," Chemical Vapor Deposition XVI and EUROCVD 14, vol. 1, Proceedings of the International Symposium, published by The Electrochemical Society, Inc., Proceedings vol. 2003-08, 2003, pp. 693-700.
Chakravarthi, et al., "Modeling the Effect of Source/Drain Sidewall Spacer Process on Boron Ultra Shallow Junctions," IEEE, 0-7803-7826-1/03, 2003, pp. 159-162.

* cited by examiner

*Primary Examiner*—Thanh Nguyen
(74) *Attorney, Agent, or Firm*—Moser IP Law Group

(57) ABSTRACT

Embodiments of the invention generally provide a method for depositing silicon-containing films. In one embodiment, a method for depositing silicon-containing material film on a substrate includes flowing a nitrogen and carbon containing chemical into a deposition chamber, flowing a silicon-containing source chemical having silicon-nitrogen bonds into the processing chamber, and heating the substrate disposed in the chamber to a temperature less than about 550 degrees Celsius. In another embodiment, the silicon containing chemical is trisilylamine and the nitrogen and carbon containing chemical is $(CH_3)_3$—N.

23 Claims, 3 Drawing Sheets

METHOD FOR SILICON BASED DIELECTRIC CHEMICAL VAPOR DEPOSITION

BACKGROUND OF THE INVENTION

1. Field of the Invention

Embodiments of the invention generally relate to methods for depositing silicon-containing materials, and more particularly, embodiments of the invention relate to chemical vapor deposition techniques for thermally depositing silicon nitride materials.

2. Description of the Related Art

Thermal chemical vapor deposition (CVD) of silicon-containing films, such as silicon nitride, is a state of the art, front end process used during semiconductor device manufacturing. For example, in a thermal CVD process for depositing silicon nitride, thermal energy is utilized for breaking one or more feedstock chemicals, which includes a silicon precursor, to make a thin film of a silicon nitride on a substrate surface. Conventional thermal CVD of silicon-containing materials is typically performed in a batch furnace or in a single wafer deposition chamber operating at elevated temperatures typically in excess of 550 degrees Celsius. As device geometries shrink to enable faster integrated circuits, the thermal budget for deposited films must be reduced in order to obtain satisfactory processing results, good production yield and robust device performance. Although some CVD processes for silicon-containing materials having deposition temperatures less than 550 degrees Celsius have been proposed, none have exhibited production worthiness suitable for large scale utilization in semiconductor device fabrication.

Thus, there is a need for a method of depositing silicon-containing materials, such as silicon nitride, at a temperature less than about 550 degrees Celsius.

SUMMARY OF THE INVENTION

Embodiments of the invention generally provide a method for depositing silicon-containing films. In one embodiment, a method for depositing a silicon-containing film on a substrate includes flowing a nitrogen and carbon containing chemical into a deposition chamber, flowing a silicon-containing source chemical having silicon-nitrogen bonds into the processing chamber, and heating the substrate disposed in the chamber to a temperature less than about 550 degrees Celsius. In another embodiment, the silicon containing chemical is trisilylamine and the nitrogen and carbon containing chemical is $(CH_3)_3$—N.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that some elements of one embodiment may be beneficially incorporated in other embodiments.

DETAILED DESCRIPTION

Embodiments of the invention provide a method for depositing a silicon-containing film, such as silicon nitride and the like, on a substrate utilizing temperatures less than about 550 degrees Celsius. Although the invention is described with reference to a single wafer thermal-chemical vapor deposition (processing) chamber 100 illustrated in FIG. 1, it is contemplated that the method may be beneficially practiced in other deposition systems, including batch deposition systems. One processing chamber in which the silicon nitride deposition process may be performed is a SiNgen®Plus chamber, available from Applied Materials, Inc., of Santa Clara, Calif. Examples of other systems which may be adapted to practice the invention include the TELFORMULA batch furnace available from Tokyo Electron Limited; the FLEXSTAR® mini-batch silicon deposition system available from Applied Materials, Inc.; and the EPSILON® Single-Wafer Epitaxial Reactors from ASM International N.V., among others.

Besides thermal-CVD, other useful processes to deposit silicon nitride materials include pulsed-CVD and atomic layer deposition (ALD). During a pulsed-CVD process, reagents, such as a silicon precursor and a reactant, are co-flowed and pulsed into the process chamber. During an ALD process, reagents, such as a silicon precursor and a reactant, are individually and sequentially pulsed into the process chamber. Plasma enhanced deposition techniques may be used during either ALD or CVD processes. Silicon-containing materials may be deposited to a single substrate or a batch of substrates during the deposition processes described herein.

Figure 1:
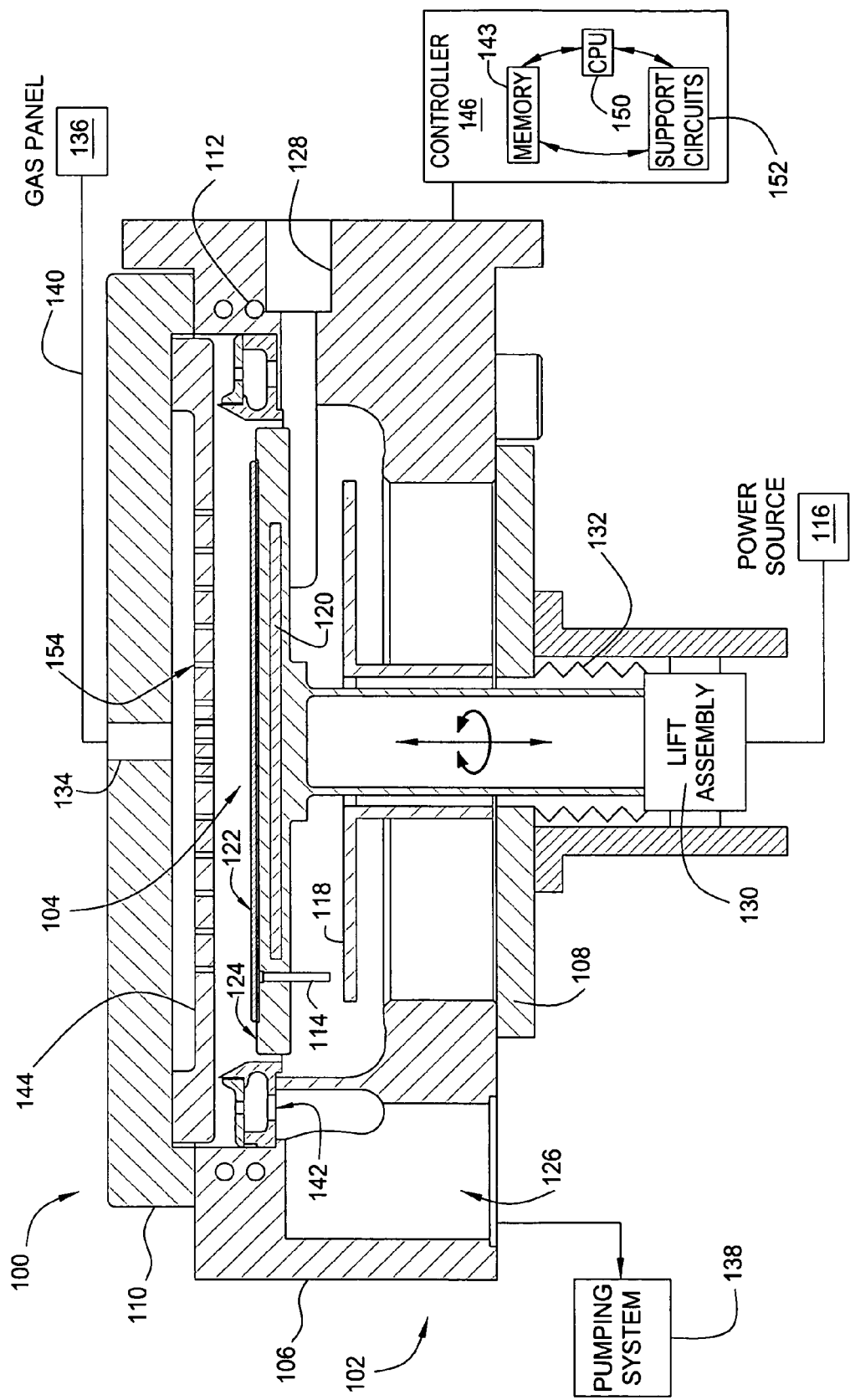
FIG. 1 is a simplified cross sectional view of one embodiment of a deposition chamber in which a method of depositing silicon nitride of the present invention may be performed.

In the embodiment of FIG. 1, the processing chamber 100 includes a chamber body 102 coupled to a pumping system 138, a controller 146, and a gas panel 136. The chamber body 102 has walls 106, a bottom 108, and a lid 110 that define an internal volume 104. The walls 106 of the body 102 may be thermally regulated. In one embodiment, a plurality of conduits 112 are disposed in the walls 106 and are configured to circulate a heat transfer fluid that regulates the temperature of the chamber body 102. The walls 106 additionally include a substrate access port 128 configured to facilitate entry and egress of a workpiece, such as a substrate 122, from the processing chamber 100.

A substrate support pedestal 124 is disposed in the internal volume 104 of the chamber body 102 and supports the substrate 122 during processing. The substrate support pedestal 124 includes a heater 120 configured to regulate the temperature of the substrate 122 and/or heat the interior volume 104 of the processing chamber 100. In the embodiment depicted in FIG. 1, the heater 120 is a resistive heating element coupled to a power source 116 and is capable of heating the substrate to a temperature of at least 550 degrees Celsius.

A pedestal lift assembly 130 is coupled to the substrate support pedestal 124 and is configured to control the elevation of the pedestal 124 between an elevated processing position (as shown in FIG. 1) and a lowered position that facilitates access to the substrate 122 disposed on the pedestal 124 through the substrate access port 128. The pedestal lift assembly 130 is sealingly coupled to the bottom 108 of the chamber body 102 by a flexible bellows 132. Optionally, the pedestal lift assembly 130 may be configured to rotate the pedestal 124 during processing.

The gas panel 136 is coupled to the processing chamber 100 and is configured to provide process chemicals, in liquid and/or gaseous form, and other gases to the internal volume 124 of the chamber body. In the embodiment depicted in FIG. 1, the gas panel 136 is coupled by a gas line 140, which is used to transfer process chemical or mixed process gases or vapors from liquid injector generated from a selected liquid chemical source, to an inlet port 134 formed in the lid 110 of the chamber body 102. It is contemplated that the inlet port 134 may be formed through one or more other locations of the chamber body 102.

A showerhead 144 is coupled to the chamber body 102 to enhance the uniform distribution of gases or vapors provided by the gas panel or liquid injector 136 into the internal volume 104 of the processing chamber 100. The showerhead 144 includes a perforated region 154. The holes formed in the perforated region 154 are configured in size, geometry, number and distribution as to provide a predefined flow distribution of gases passing through the showerhead 144 to the substrate 122.

Lift pins 114 (of which one is shown in FIG. 1) are provided to separate the substrate 122 from the upper surface of the substrate support pedestal 124 to facilitate substrate hand-off with a robot (not shown) entering the chamber body through the access port 128. In the embodiment depicted in FIG. 1, a lift plate 118 is disposed below the substrate support pedestal 124 and arranged such that as the pedestal 124 is lowered, the lift pins 114 come in contact with the lift plate 118 before the pedestal 124 has completed its downward travel. The lift plate 118 supports the lift pins 114 as the pedestal 124 continues downward, causing the lift pins 114 to extend from the upper surface of the pedestal. The position of the lift plate 118 and/or the length of the lift pins 114 are configured such that the substrate 122 becomes spaced-apart from the substrate support pedestal 124 and generally aligned with the access port 128 when the pedestal 124 is in the lowered position.

The pumping system 138 is coupled to a pumping port 126 formed in the chamber body 102. The pumping system 138 generally includes a throttle valve and one or more pumps arranged to control the pressure within the internal volume 104 of the processing chamber 100. Gases flowing from the internal volume 104 to the pumping port 126 may be routed through a pumping ring 142 to enhance gas flow uniformity across the surface of the substrate 122. One pumping ring which may be adapted to benefit from the invention is described in U.S. patent Ser. No. 10/911,208, filed Oct. 4, 2004, which is hereby incorporated by reference in its entirety.

The controller 146 is coupled to the various components of the processing chamber 100 to facilitate control of a silicon nitride deposition process as described below. The controller 146 generally includes a central processing unit (CPU) 150, a memory 148, and support circuits 152. The CPU 150 may be one of any form of computer processor that can be used in an industrial setting for controlling various chambers and sub processors. The memory 148, or computer readable medium, may be one or more of readily available memory, such as random access memories (RAM), read-only memory (ROM), floppy disk, hard drive, flash memory, or any other form of digital storage, local or remote. The support circuits 152 are coupled to the CPU 150 for supporting the processor in a conventional manner. These support circuits 152 include cache, power supplies, clock circuits, input/output circuitry and subsystems, and the like. A process, for example, a silicon-containing material deposition process 200 described below, is generally stored in the memory 148, typically as a software routine. The software routine may also be stored and/or executed by a second CPU (not shown) that is remotely located from the hardware being controlled by the CPU 150. Although the deposition process of the present invention is described as being implemented as a software routine, some of the method steps that are disclosed therein may be performed in hardware as well as by the software controller. As such, the invention may be implemented in software as executed upon a system computer, in hardware as an application specific integrated circuit or other type of hardware implementation, or a combination of software and hardware.

Figure 2:
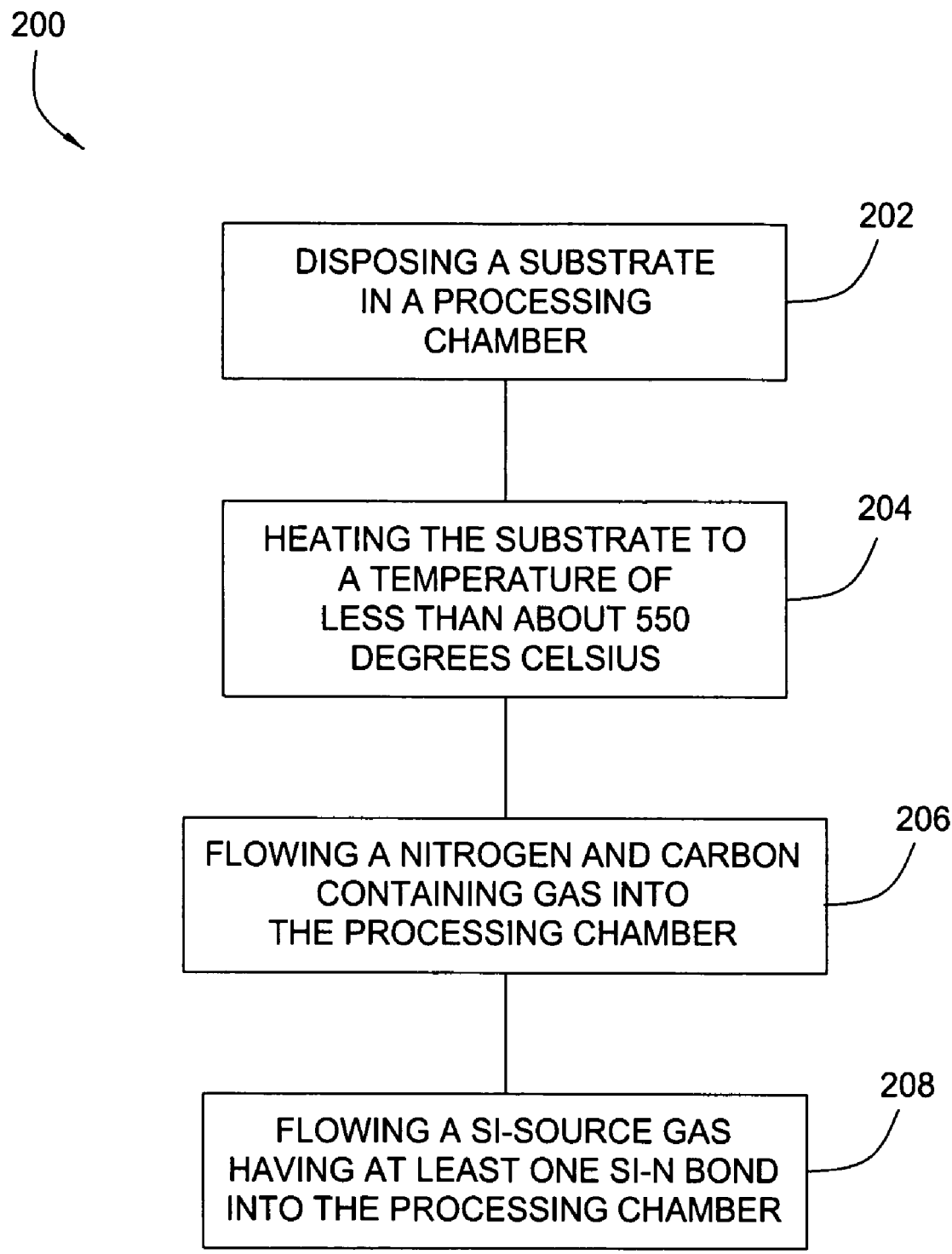
FIG. 2 is a flow diagram of one embodiment of a method of depositing a silicon nitride film.

FIG. 2 is a flow diagram of one embodiment of a silicon-containing material deposition process 200, which may be performed in the processing chamber 100, or other suitable equipment. The method 200 begins at step 202 by placing the substrate 122 on the substrate support pedestal 124. The substrate 122 on which embodiments of the silicon nitride deposition process of the invention may be practiced include, but are not limited to semiconductor wafers, such as crystalline silicon (e.g., Si<100> or Si<111>), silicon oxide, strained silicon, SOI, silicon germanium, and doped or undoped polysilicon. The substrate surface on which the silicon-containing layer is deposited may be bare silicon, a dielectric material, a conductive material, a barrier material, and the like. Optionally, the substrate 122 may be pretreated prior to the deposition of the silicon-containing material by polishing, etching, reduction, oxidation, halogenation, hydroxylation, annealing and/or baking.

At step 204, the substrate 122 is heated to a temperature less than about 550 degrees Celsius. Optionally, the substrate 122 may be heated to a temperature above 550 degrees Celsius depending on fabrication requirements. In one embodiment, the substrate 122 is heated by applying power from the power source 116 to the resistive heating element (i.e., the heater 120) to heat the substrate 122 to a temperature between about 300 and about 500 degrees Celsius, and in yet another embodiment, the substrate 122 is heated to less than about 450 degrees Celsius.

At step 206, a nitrogen and carbon containing chemical is provided to the interior volume of the processing chamber 100. The nitrogen and carbon containing chemical is generally provided from the gas panel 136 to the inlet 104. The nitrogen and carbon containing chemicals may be in liquid and/or gaseous form.

In one embodiment, the nitrogen and carbon containing chemical has the general chemical formula of $R(C)\text{—}C_xN_yR(N)$, where R(C) is hydrogen or other hydrocarbon compound group, R(N) is nitrogen or other nitrogen containing compound group, and x and y are positive integers. Examples of suitable nitrogen and carbon containing gases include, but are not limited to, $(CH_3)_3\text{—}N$, $H_3C\text{—}NH_2$, methylamine, $H_3C\text{—}NH\text{—}NH_2$, methylhydrazine, $(H_3C)\text{—}N\text{=}N\text{—}H$, and $HC\text{≡}N$, among others.

The nitrogen and carbon containing chemical may alternatively be characterized as a carbon, nitrogen and hydrogen containing compound that can be disassociated below 500 degrees Celsius with a high vapor pressure at room temperatures. Other examples of suitable nitrogen and carbon containing chemicals include, but are not limited to, $CH_5N$ (vapor pressure of about 353 kPa at 25 degrees Celsius), methylhydraine ($CH_6N_2$, vapor pressure of about 66 kPa at 25 degrees Celsius), and hydrocyanic acid (CHN; vapor pressure of about 98.8 kPa at 25 degrees Celsius), among others.

At step 208, a flow of Si-source chemical having at least one Si—N bond is provided to the interior volume 104 of the chamber body 102 through the showerhead 144 from the gas panel 136. The Si-source chemical may be in liquid and/or gaseous form. In one embodiment, the Si-source chemical includes at least one of $(SiR_3)_3$—N, $(SiR_3)_2$N—$N(SiR_3)_2$ and $(SiR_3)$N=$(SiR_3)$N, wherein R is hydrogen (H), or a hydrocarbon reagent or a fragment consisting of methyl, ethyl, phenyl, tertiary, butyl and their combinations. In one embodiment, R is free of halogens and contains hydrogen. In another embodiment, R includes one or more halogens elements and contains hydrogen. Examples of suitable Si-source gases include $(SiH_3)_3$—N, $(SiH_3)_2$N—$N(SiH_3)_2$, $(SiH_3)$N=$(SiH_3)$N and trisilylamine, among others.

Although one gas line 140 is shown disposed between the gas panel 136 and the inlet port 134, it is contemplated that the Si-source chemical and the nitrogen and carbon containing chemical are provided to the processing chamber 100 in separate gas lines. It is also contemplated that the gas lines may be temperature controlled. It is further also contemplated that carbon containing chemicals in step 206 together with nitrogen and/or Si-containing chemicals in step 208 can be introduced to inlet port 134 simultaneously, or sequentially. As such, either step 206 may occur before step 208, or step 206 may occur after step 208. Furthermore, steps 206, 208 may be executed to selectively control the chemical dosing time to ensure atomic layer coverage, and to allow purging between each step with desirable inert gases, such as argon.

As the Si-source chemical and the nitrogen and carbon containing chemical are combined in the substrate processing chamber 100, a silicon-containing material, such as a silicon nitride ($Si_3N_4$) film, is formed on the heated substrate 122. The deposited silicon-containing material exhibit good film qualities such as reflective index and wet etch rate, and deposition rates greater than 5 Å/min. In one embodiment, the silicon-containing film is deposited at a rate from about 10 Å/min to about 500 Å/min and is deposited to a thickness from about 10 Å to about 1,000 Å. The silicon-containing film formed as described above exhibits low hydrogen content and includes a small amount of carbon doping, which enhances boron retention in PMOS devices. In embodiments where a halogen-free Si-source chemical is utilized, improved wet etch rate may be realized.

A carrier gas may be provided at step 206 and/or step 208 to control the partial pressure of the nitrogen and carbon containing chemical and/or the Si-source chemical from a few mTorr to a few hundred Torr, and to control the total process pressure from about 100 mTorr to about 740 Torr in single wafer chambers. In another embodiment, the pressure within the processing chamber is maintained between about 10 to 740 Torr. The carrier gas may be provided to control the partial pressure of the nitrogen and carbon containing chemical and/or the Si-source chemical from about 100 mTorr to 1 Torr in batch processing systems. Examples of suitable carrier gases include $N_2$, Ar and He, among others.

In another embodiment, the method 200 includes heating the substrate 122 at step 202 to a temperature of between a temperature between about 300 and about 500 degrees Celsius, for example 450 degrees Celsius. A nitrogen and carbon chemical, for example, $(CH_3)_3$—N, is provided to the processing chamber 100 at step 206. The nitrogen and carbon chemical is delivered at a rate between about 100 sccm to about 3000 sccm, for example about 1000 sccm to about 2000 sccm. A Si-source chemical, for example, trisilylamine, is provided to the processing chamber 100 at step 208 at a rate between about 1 sccm to about 300 sccm, or in another example, at a rate between about 13 sccm to about 130 sccm. In embodiments where a carrier gas is combined with the Si-source chemical, the total rate for a liquid source is about 10 sccm to 10,000 sccm. Generally, a flow ratio for $(CH_3)_3$—N to trisilylamine is maintained at a ratio of about 10:1 to about 1:1. In one embodiment, the $(CH_3)_3$—N to trisilylamine flow ratio is 3:1.

Optionally, an oxygen precursor may be added to the deposition method 200, typically at step 206 and/or step 208, to form silicon oxide or silicon oxynitride. Oxygen precursors that may be used in the deposition processes described herein include atomic oxygen, oxygen ($O_2$), ozone ($O_3$), $H_2O$, $H_2O_2$, organic peroxides, alcohols, $N_2O$, NO, $NO_2$, $N_2O_5$, derivatives thereof and combinations thereof.

The method 200 when practiced in a single-wafer processing chamber 100 as described above allows tuning of the deposited film, particularly the ability to manage and control the Si/N/C/H content of the films. By controlling the relative Si, N, C and H content of the film, film properties such as wet etch rate, dry etch rate, dielectric constant, and the like may be tailored for specific applications. For example, by reducing the hydrogen content, the film may be deposited with higher tensile stress.

Additionally, by using N—Si—R or N—Si—Si—R type of precursors, the dissociation of the Si-source molecule takes place at lower temperatures, thereby enabling lower temperature processing. The reason for this is that the functional group (Si—R or Si—Si) is weakly bonded compared to Si—N bond. Furthermore, nitrogen-containing source chemicals used in this invention that contain a carbon and hydrogen function group, which react with R or Si—R from N—Si—R or N—Si—Si—R in the Si-source, allow the R group to become dissociated and more easily removed than without reacting with nitrogen-source chemical. Thus, the nitrogen-source chemical functions as catalyst in this process in addition to providing additional nitrogen and carbon source to the final film. Thus, the nitrogen-source advantageously facilitates low temperature processing, e.g., at temperatures less than about 550 degrees Celsius.

Silicon-containing materials are deposited utilizing the method 200 described above are used throughout electronic features/devices due to several physical properties. Silicon-nitrogen-containing materials, such as silicon nitride, are electric insulators, as well as barrier materials. The barrier properties inhibit ion diffusion between dissimilar materials or elements when silicon-nitride-containing material is placed therebetween, such as a gate material and an electrode, or between a low dielectric constant porous materials and copper. Therefore, silicon-nitride-containing materials may be used in barrier layers, protective layers, off-set layers, spacer layers and capping layers. Another physical property of silicon nitride materials is a high degree of hardness. In some applications, silicon-containing materials may be used as a protective coating for various optical devices as well as tools. Another physical property of silicon-nitride-containing material such as silicon nitride is etch selectivity to silicon oxide, i.e., silicon nitride can be used as etch stop layer under a silicon oxide dielectric layer to accurately control etch depth without over etching or under etching. Yet another physical property of silicon-nitrogen-containing materials is that the carbon and hydrogen concentration can be used to tune film stress, such as high tensile stress which is desirable in selected applications.

Figure 3A:
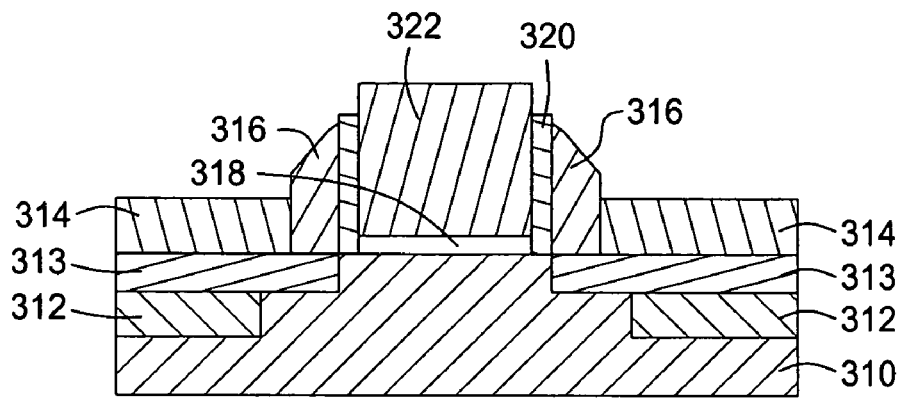
FIGS. 3A-B are cross sectional views of a MOSFET transistor having a silicon nitride layer at least partially deposited according to the method of FIG. 2.
Figure 3B:
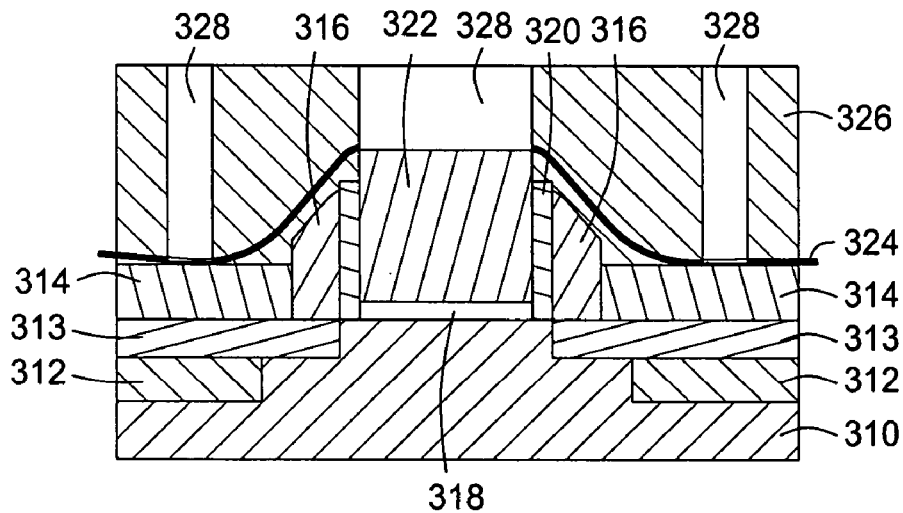
Figure 4:
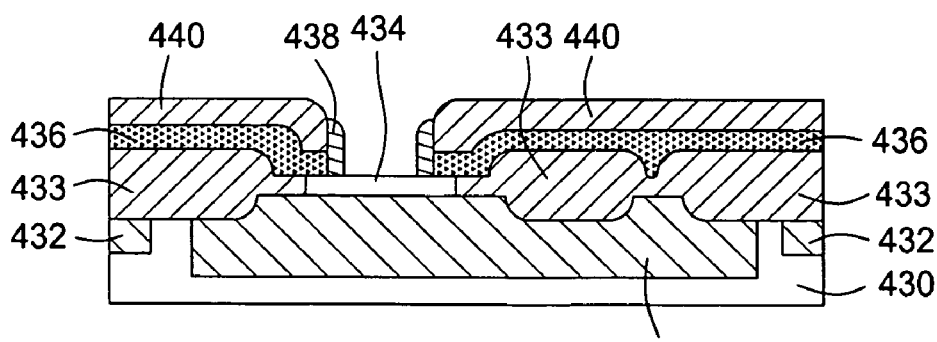
FIG. 4 is a cross section of an exemplary bi-polar transistor having a silicon nitride layer at least partially deposited utilizing the method of FIG. 2.

In some embodiments, silicon nitride materials may be deposited as various layers in MOSFET and bipolar transistors as depicted in FIGS. 3A-B and 4. For example, FIG. 3A shows silicon nitride materials deposited within a MOSFET containing both recessed and elevated source/drains. Source/drain layer 312 is formed by ion implantation of the substrate 310. Generally, the substrate 310 is doped n-type while the source/drain layer 312 is doped p-type material. Silicon-containing layer 313, usually Si, SiGe or SiGeC, is selectively and epitaxially grown on the source/drain layer 312 or directly on substrate 310 by CVD methods. Silicon-containing layer 314 is also selectively and epitaxially grown on the silicon-containing layer 313 by CVD methods. A gate barrier layer 318 bridges the segmented silicon-containing layer 313. Generally, gate barrier layer 318 maybe composed of silicon oxide, silicon oxynitride, hafnium oxide or hafnium silicate. Partially encompassing the gate barrier layer 318 is a spacer 316, which is usually an isolation material such as a nitride/oxide/nitride stack (e.g., $Si_3N_4/SiO_2/Si_3N_4$). Alternatively, spacer 316 may be a homogeneous layer of a silicon nitride material, such as silicon nitride or silicon oxynitride deposited by the various methods described herein. Gate layer 322 (e.g., polysilicon) may have a spacer 316 and off-set layers 320 disposed on either side. Off-set layers 320 may be composed of a silicon nitride material, such as silicon nitride, deposited by the various processes described herein.

FIG. 3B shows etch stop layer 324 for source/drain and gate contact via etch deposited over a MOSFET. Etch stop layer 324 may be composed of a silicon nitride material, such as silicon nitride, deposited by the various methods described herein. A pre-metal dielectric layer 326 (e.g., silicon oxide) is deposited on etch stop layer 324 and contains contact hole vias 328 formed thereon.

In another embodiment, FIG. 4 depicts deposited silicon nitride material as several layers within a bipolar transistor using various embodiments of the invention. The silicon-containing compound layer 434 is deposited on an n-type collector layer 432 previously deposited on substrate 430. The transistor further includes isolation layer 433 (e.g., $SiO_2$, $SiO_xN_y$ or $Si_3N_4$), contact layer 436 (e.g., heavily doped poly-Si), off-set layer 438 (e.g., $Si_3N_4$), and a second isolation layer 440 (e.g., $SiO_2$, $SiO_xN_y$ or $Si_3N_4$). Isolation layers 433 and 440 and off-set layer 438 may be independently deposited as a silicon nitride material, such as silicon oxynitride, silicon carbon nitride, and/or silicon nitride deposited by the various processes described herein. In one embodiment, the isolation layers 433 and 440 are silicon oxynitride and off-set layer 338 is silicon nitride.

Thus, a method for depositing a silicon-containing layer, such as silicon nitride, has been provided. The method described above is suitable for device fabrication having small critical dimensions requiring low thermal budgets due to the use of deposition temperatures less than about 550 degrees Celsius, which advantageously facilitates robust circuit fabrication using sub 90 nm technology.

While the foregoing is directed to embodiments of the present invention, other and further embodiments of the invention may be devised without departing from the basic scope thereof, and the scope thereof is determined by the claims that follow.

What is claimed is:

1. A method for depositing a silicon-containing film on a substrate, the method comprising:
    heating a substrate disposed in a processing chamber to a temperature less than about 550 degrees Celsius;
    flowing a silicon-free, nitrogen and carbon containing chemical into the processing chamber, the silicon-free, nitrogen and carbon containing chemical comprising $(H_3C)$—N=N—H;
    flowing a silicon-containing source chemical with silicon-nitrogen bonds into the processing chamber; and
    depositing a silicon and nitrogen containing film on the substrate.

2. The method of claim 1, wherein the silicon-containing source chemical is at least one of $(SiR_3)_3$—N, $(SiR_3)_2$N—N$(SiR_3)_2$ and $(SiR_3)$N=$(SiR_3)$N, wherein R is hydrogen (H), or a hydrocarbon reagent or a fragment consisting of methyl, ethyl, phenyl, tertiary butyl and their combinations.

3. The method of claim 2, wherein the R is free of halogens and contains hydrogen.

4. The method of claim 2, wherein the R includes one or more halogen elements.

5. The method of claim 1, wherein the silicon-containing source chemical is $(SiH_3)_3$—N.

6. The method of claim 1, wherein the silicon-containing source chemical is $(SiH_3)_2$N—N$(SiH_3)_2$.

7. The method of claim 1, wherein the silicon-containing source chemical is $(SiH_3)$N=$(SiH_3)$N.

8. The method of claim 1, wherein the silicon-containing source chemical is trisilylamine.

9. The method of claim 1, wherein the step of heating the substrate further comprises:
    heating the substrate to a temperature between about 300 to about 500 degrees Celsius; and
    maintaining a pressure within the processing chamber between about 10 to 740 Torr.

10. The method of claim 1 further comprising:
    flowing an oxygen precursor into the processing chamber.

11. The method of claim 10, wherein the oxygen precursor is at least one of atomic-oxygen, oxygen ($O_2$), ozone ($O_3$), $H_2O$, $H_2O_2$, organic peroxides, alcohols, $N_2O$, NO, $NO_2$, $N_2O_5$ and derivatives thereof.

12. The method of claim 1, wherein the step of depositing the silicon-containing film further comprises:
    depositing a single atomic layer of silicon-containing material.

13. A method for depositing a silicon-containing film on a substrate, the method comprising:
    heating a substrate disposed in a processing chamber to a temperature between about 400-500 degrees Celsius;
    flowing a silicon-free, nitrogen and carbon containing chemical into the processing chamber, the silicon-free, nitrogen and carbon containing chemical comprising $(H_3C)$—N=N—H;
    flowing a silicon-containing source chemical with silicon-nitrogen bonds into the processing chamber, wherein the silicon-containing source chemical is at least one of $(SiR_3)_3$—N, $(SiR_3)_2$N—N$(SiR_3)_2$ and $(SiR_3)$N=$(SiR_3)$N, wherein R is hydrogen (H), or a hydrocarbon reagent or a fragment consisting of methyl, ethyl, phenyl, tertiary butyl and their combinations; and
    depositing a silicon and nitrogen containing film on the substrate.

14. The method of claim 13, wherein the step of heating the substrate further comprises:
    heating the substrate to a temperature less than about 450 degrees Celsius.

15. The method of claim 13, wherein the R is free of halogens and contains hydrogen.

16. The method of claim 13, wherein the R includes one or more halogen elements.

17. The method of claim 13, wherein the silicon-containing source chemical is $(SiH_3)_3$—N.

18. The method of claim 13, wherein the silicon-containing source chemical is $(SiH_3)_2N$—$N(SiH_3)_2$.

19. The method of claim 13, wherein the silicon-containing source chemical is trisilylamine.

20. The method of claim 13, wherein the silicon-containing source chemical is trisilylamine.

21. The method of claim 14, further comprising: flowing an oxygen precursor into the processing chamber.

22. The method of claim 21, wherein the oxygen precursor is at least one of atomic-oxygen, oxygen ($O_2$), ozone ($O_3$), $H_2O$, $H_2O_2$, organic peroxides, alcohols, $N_2O$, NO, $NO_2$, $N_2O_5$ and derivatives thereof.

23. The method of claim 13, wherein the step of depositing the silicon-containing film further comprises:

depositing a single atomic layer of silicon-containing material.

* * * * *

UNITED STATES PATENT AND TRADEMARK OFFICE
CERTIFICATE OF CORRECTION

PATENT NO. : 7,473,655 B2
APPLICATION NO. : 11/155646
DATED : January 6, 2009
INVENTOR(S) : Yaxin Wang et al.

Page 1 of 1

It is certified that error appears in the above-identified patent and that said Letters Patent is hereby corrected as shown below:

In column 9, line 6, Claim 19, delete "trisilylamine" and insert
-- "$(SiH_3)N=(SiH_3)N$" --, therefor;

In column 9, line 9, Claim 21, delete "method of claim 13" and insert
-- "method of claim 14" --, therefor.

Signed and Sealed this

Sixth Day of July, 2010

David J. Kappos
*Director of the United States Patent and Trademark Office*